(12) United States Patent
Purol

(10) Patent No.: US 10,566,915 B1
(45) Date of Patent: Feb. 18, 2020

(54) ACOUSTIC GUITAR ENERGY HARVESTER

(71) Applicant: David Merritt Purol, Romney, WV (US)

(72) Inventor: David Merritt Purol, Romney, WV (US)

(*) Notice: Subject to any disclaimer, the term of this patent is extended or adjusted under 35 U.S.C. 154(b) by 0 days.

(21) Appl. No.: 16/393,392

(22) Filed: Apr. 24, 2019

Related U.S. Application Data

(63) Continuation-in-part of application No. 16/155,214, filed on Oct. 9, 2018, now Pat. No. 10,276,135.

(51) Int. Cl.
| | |
|---|---|
| *G10H 1/02* | (2006.01) |
| *G10D 3/02* | (2006.01) |
| *H02N 2/18* | (2006.01) |
| *G10D 1/08* | (2006.01) |

(52) U.S. Cl.
CPC .............. *H02N 2/186* (2013.01); *G10D 3/02* (2013.01); *G10D 1/08* (2013.01)

(58) Field of Classification Search
CPC .... G10K 11/178; G10K 11/04; G10K 11/346; G10K 15/02; G10K 15/04; G10K 11/352; G01H 11/08; G01H 9/006; G01H 1/00; G10H 2220/525; G10H 3/18
See application file for complete search history.

(56) References Cited

U.S. PATENT DOCUMENTS

| | | | | |
|---|---|---|---|---|
| 5,056,400 | A * | 10/1991 | Wachi ...................... | G10H 3/18 84/600 |
| 8,592,668 | B1* | 11/2013 | Kamimoto ............... | G10D 3/00 84/294 |
| 2005/0247183 | A1* | 11/2005 | Towers ................... | G10D 1/085 84/298 |
| 2007/0245884 | A1* | 10/2007 | Yamaya ................... | G10H 1/32 84/731 |
| 2008/0202310 | A1* | 8/2008 | Coke ....................... | G10D 1/085 84/291 |
| 2012/0260787 | A1* | 10/2012 | Nash ........................ | G10D 1/08 84/294 |
| 2014/0060291 | A1* | 3/2014 | Davies ..................... | G10D 1/02 84/734 |
| 2019/0304425 | A1* | 10/2019 | Topel ....................... | G10H 3/20 |

\* cited by examiner

*Primary Examiner* — Marlon T Fletcher
(74) *Attorney, Agent, or Firm* — Purol Patents

(57) ABSTRACT

The present invention is directed to an acoustic resonator within an acoustic chamber such as a stringed instrument body. The acoustic resonator is provided with a piezoelectric material. The kinetic energy derived from the acoustic chamber creates vibrations of sound producing a corresponding or sympathetic mechanical vibration to the piezoelectric material. As a consequence, the piezoelectric material will generate electrical energy which will undergo conditioning by energy harvester electronics. The conditioned electrical energy is used to provide power to multiple devices including on-board electronics or a USB charging port.

11 Claims, 4 Drawing Sheets

ACOUSTIC GUITAR ENERGY HARVESTER

CROSS-REFERENCE TO RELATED APPLICATION

This application is a continuation-in-part of application Ser. No. 16/155,214, filed on Oct. 9, 2018, now U.S. Pat. No. 10,276,135.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR 1.71(d).

BACKGROUND OF THE INVENTION

The following includes information that may be useful in understanding the present invention(s). It is not an admission that any of the information provided herein is prior art, or material, to the presently described or claimed inventions, or that any publication or document that is specifically or implicitly referenced is prior art.

1. Field of the Invention

The present invention relates generally to the field of stringed instruments and devices relating thereto having a resonance device incorporating an energy harvester for providing a source of power. When a stringed instrument is played the vibratory movement of the strings set the resonance device in motion producing mechanical vibrations which can be converted into electrical energy.

2. Description of the Related Art

Many acoustic and semi-hollow guitars have on-board electronics built into the instruments body which requires the use of a battery supply. The depletion of this battery supply will result in the failure of the on-board electronics with the unfortunate consequence of interrupting one's performance.

Conventional stringed instruments when played have a large amount of the vibratory sound being produced absorbed and dissipated by the body of the instrument. The playing by the player provides kinetic energy resulting in the mechanical vibratory motion creating the instruments volume. It is the provided kinetic energy which has the potential to be used for generating power. However, the prior art fails to capitalize on this potential and the kinetic energy provided by the player goes unused. Thus, a need exists for a device which can take the kinetic energy of an instrument and convert it to a usable source of power.

BRIEF SUMMARY OF THE INVENTION

In view of the foregoing disadvantages inherent in the known guitar art, the present invention provides for a novel energy harvester. The general purpose of the present invention, which will be described subsequently in greater detail is to provide an acoustic resonator within a stringed instrument body and provide the resonator with a piezoelectric material. Tuning forks are an excellent acoustic resonator and are readily available. The playing of the stringed instrument creates vibrations of sound producing a corresponding or sympathetic mechanical vibration to the tuning fork. As a consequence, the piezoelectric material will generate electrical energy. However, this electrical energy is continuously varying depending on the level of playing and also does not possess enough power for directly acting as a power supply. The generated electrical energy has to be conditioned to a constant sufficient power level for practical use and thus is provided an energy harvesting electronics.

It is also an object of the present invention to provide a coupler for securing a novel energy harvester within a stringed instrument body. The acoustic resonator coupling incorporates the use of retractable prong members to imbed the coupling to the wood of the instrument body. The prong members penetrate the wood leaving only a very small prick mark that does not mar the material of the instrument body thus retaining the value and aesthetics of the instrument. Provisions are provided on the acoustic resonator coupling permitting for the mounting of the energy harvester.

The present invention holds significant improvements and serves as a coupling for an energy harvester within an instrument body. For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

BRIEF DESCRIPTION OF THE DRAWINGS

The figures which accompany the written portion of this specification illustrate a preferred embodiment of use for the energy harvester device of the present invention, constructed and operative according to the teachings of the present invention.

The various embodiments of the present invention will hereinafter be described in conjunction with the appended drawings, wherein like designations denote like elements.

DETAILED DESCRIPTION

Figure 1:
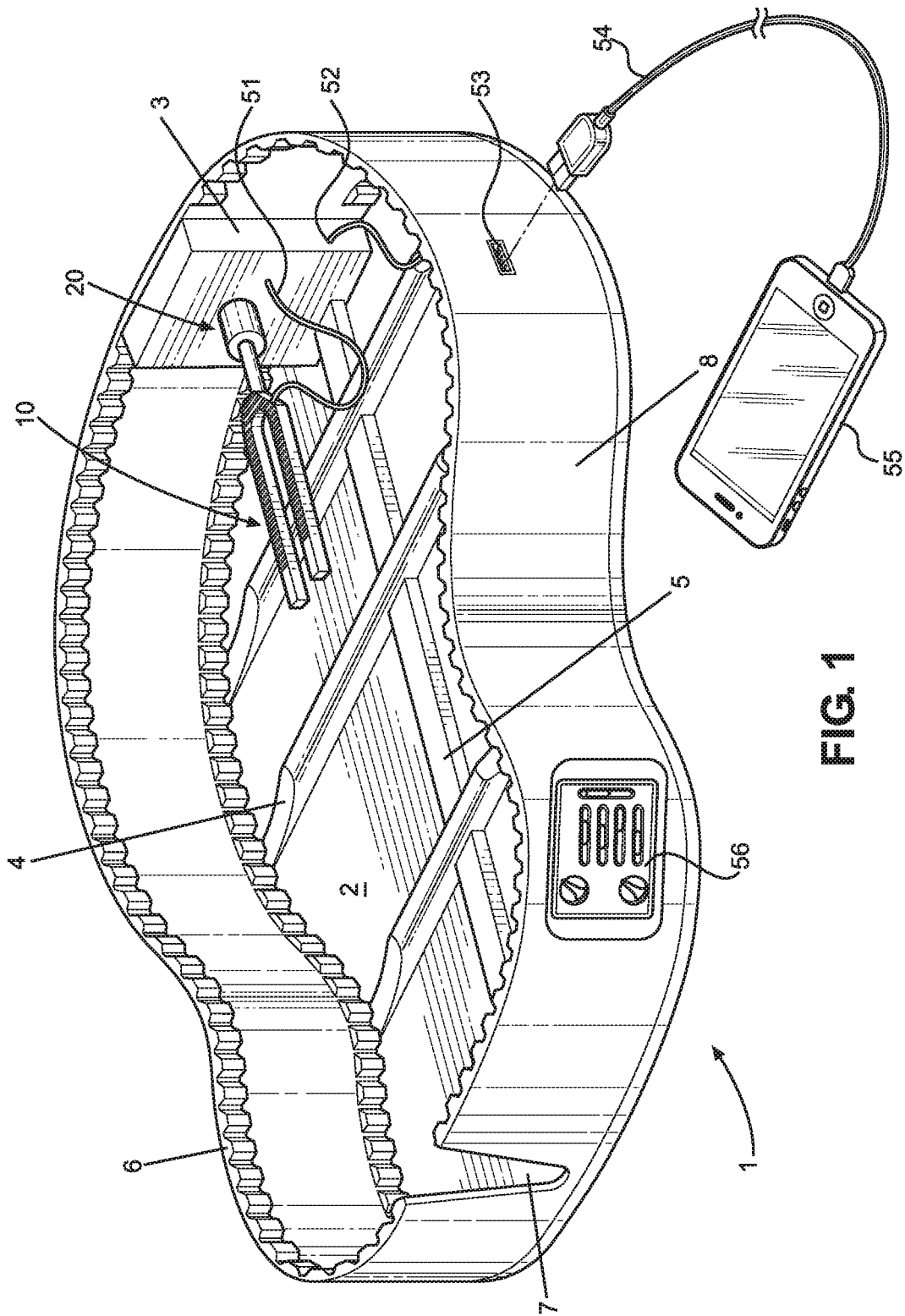
FIG. 1 shows a perspective view illustrating an instrument body having an energy harvester device mounted thereon according to an embodiment of the present invention.

As discussed above, an embodiment of the present invention relates to an energy harvester device using an acoustic resonator coupled to an instrument body such as an acoustic or semi-hollow body guitar. Referring to the drawings by numerals of reference there is shown in FIG. 1 a body 1 of a stringed instrument such as an acoustic guitar. The body 1 is commonly constructed from solid tonewoods that reproduce sound well including one of mahogany, rosewood, spruce, or cedar and formed into an acoustic chamber. It is with these tonewoods that the acoustic resonator of the present invention is suited, as will be further described.

The body 1 is defined by a bottom such as a board or back piece 2 circumscribed by a side wall 8 forming an acoustic chamber. The upper and lower portions of the side wall 8 are provided with a continuous or serrated lining strip 6 to which the bottom board 2 and the top sound board (not shown) are attached. The side wall 8 has a slot 7 for accommodating the heel of a neck (not shown). The body 1 is strengthened by cross bracing 4 and reinforcements strips 5. The body 1 is provided with a tail block 3 that stabilizes where the sides of the side wall 8 meet at the lower bout. The tail block 3 is provided with an interior volume suitable for housing energy harvester electronics 60. Thus, the tail block 3 functions as an energy harvester module providing for the coupling of lead wires 51 and supply wires 52, as will be further described. Mounted to the tail block 3 is a coupler 20 of the present invention. Secured to the coupling 20 is an acoustic resonator such as a tuning fork 11.

Figure 2:
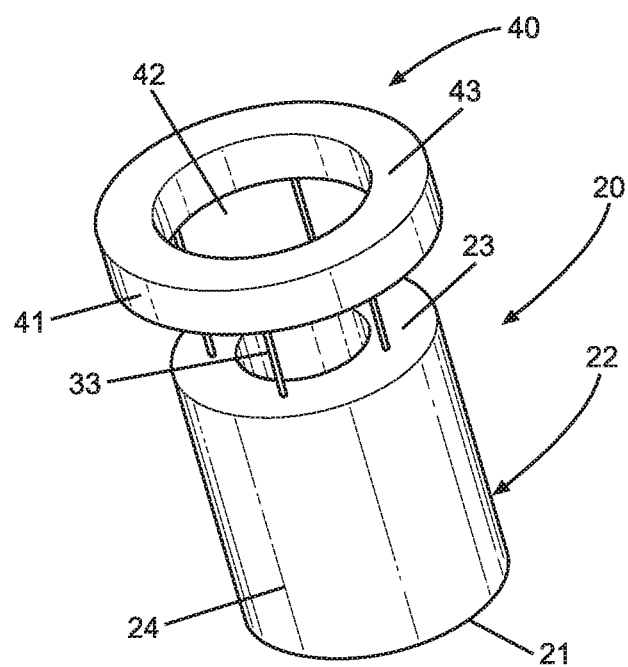
FIG. 2 is a perspective view illustrating an acoustic resonator coupling according to an embodiment of the present invention of FIG. 1.
Figure 3:
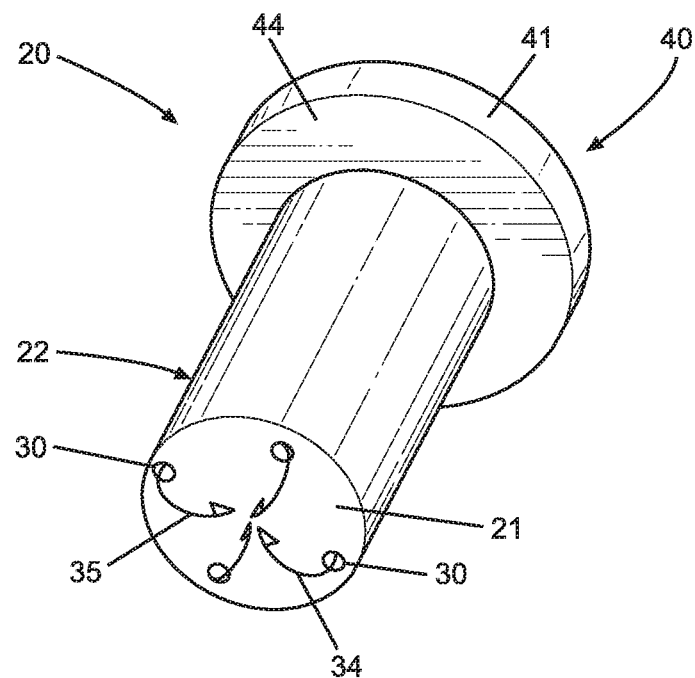
FIG. 3 is a bottom perspective view illustrating an acoustic resonator coupling with the prong members extended according to an embodiment of the present invention of FIG. 1.
Figure 7:
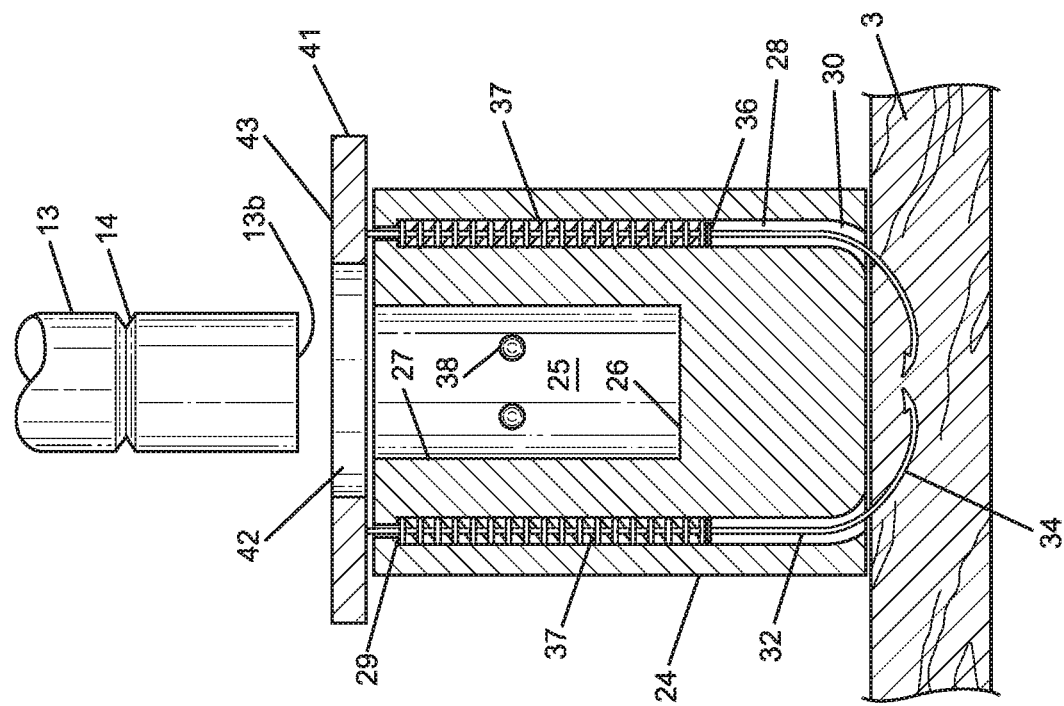
FIG. 7 is a cross sectional view illustrating an acoustic resonator being mounted to a coupling secured to the instrument body according to an embodiment of the present invention of FIG. 1.
Figure 6:
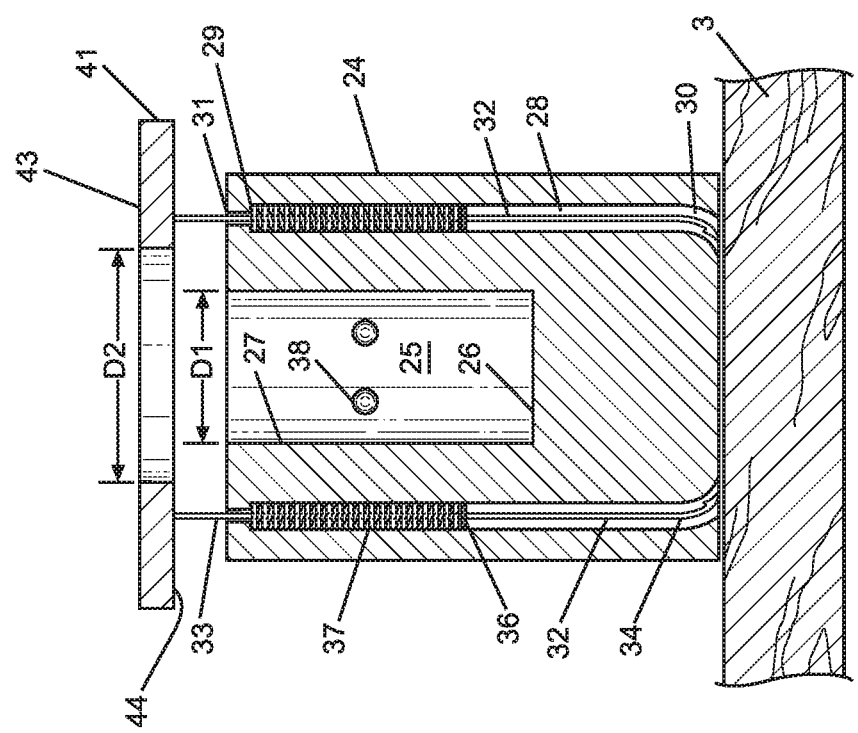
FIG. 6 is a cross sectional view illustrating an acoustic resonator coupling with the prong members retracted prior to mounting according to an embodiment of the present invention of FIG. 1.

Referring now to FIGS. 2, 3 along with FIGS. 6, 7 there is shown the coupler 20 formed as an elongate body 22 of a generally cylindrical shape having an outer surface 24. The elongate body 22 has at an end a first surface 23 and at an opposed end a second surface 21. Centrally disposed on the first surface 23 is a blind bore 25 having a sidewall 27 and terminating at a bore wall 26. The blind bore 25 establishes an opening of a first diameter D1. The elongate body 22 is provided with a spring biased ball plunger 38 in communication with the blind bore 25 as will be further discussed.

The elongate body 22 is provided with one or more channels 28 each of which are identical and of which a description of one channel 28 is applicable to the other remaining channels 28. The channel 28 has an end wall 29 adjacent to the first surface 23 of the elongate body 22. Disposed through the first surface 23 and in communication with the end wall 29 is an aperture 31. The channel 28 extends longitudinally between the outer surface 24 and the sidewall 27 starting from the end wall 29 and exiting to the second surface 21. The portion of the channel 28 adjacent to and exiting from the second surface 21 is radiussed inwardly towards a center of the elongate body 22 so as to define a curved channel ramp 30.

The coupler 20 is provided with an actuating member 40 of a generally disc shape having an upper surface 43 and an opposed lower surface 44 bounded by an outer periphery 41. The actuating member 40 has centrally disposed therethrough an opening 42 of a second diameter D2. As shown in FIG. 6, the second diameter D2 is of a size larger than the first diameter D1 as will be further described.

Each channel 28 is provided with a respective prong member 32 having a limited resilience so as to flex through the curved channel ramp 30. Each prong member 32 has a first end 33 attached to the lower surface 44 of the actuating member 40 and extending therefrom through the aperture 31 and into the channel 28. The smaller sized opening of the aperture 31 in relation to the end wall 29 aids in guiding the first end 33 so that the prong member 32 will not buckle. The prong member 32 has at an end distal from the first end 33 a curved portion 34. The curved portion 34 has disposed at its terminal end a barb 35 configured to penetrate the tail block 3. While the barb 35 is desirable for penetrating most materials, it may not be necessary to include the curved portion 34 with a barb 35 for penetrating harder materials. In this case the distal end of the curved portion 34 may be simply sharpened to a point.

As shown in FIGS. 2 and 6 the coupler 20 has a retracted position in which the curved portion 34 of the prong member 32 resides within the curved channel ramp 30 and the first end 33 extends above the first surface 23 so as to elevate the actuating member 40 thereabove. FIGS. 3 and 7 depict the coupler 20 in an engaged position in which the actuating member 40 has been pressed downward so as to abut the first surface 23 thereby advancing the prong member 32 downwardly into the tail block 3.

The prong member 32 may advantageously be composed of a relatively stiff wire which is configured to suitably transmit mechanical force afforded to it by the pressing of the actuating member 40. The relatively stiff wire is desirable for it is able to be manipulated to have different strength requisites. For example, the curved portion 34 can be thickened and hardened so as to be more rigid than the remainder of the prong member 32. The thickening and hardening of the curved portion 34 allows for it to maintain the curved shape even as the actuating member 40 is pressed downwardly. This permits for the curved portion 34 to make an arc as it penetrates the tail block 3 placing the barb 35 so that it is positioned generally underneath and center to the elongate body 22. This is advantageous for it allows the coupler 20 to be securely mounted to materials that are thin and would not readily accept conventional fasteners such as screws or nails.

In certain circumstances it may be desirable to provide one or more of the prong members 32 with a bias so that the curved portion 34 is always urging the barb 35 in contact with the tail block 3. Such a need may arise when the body 1 of the stringed instrument is being played harshly and vibrating excessively. In this instance the prong member 32 is provided with a protuberance 36 approximately mid-point its length. Disposed between the protuberance 36 and the end wall 29 of the channel 28 is a compression spring 37. One end of the spring 37 abuts against the end wall 29 and its opposed end abuts against the protuberance 36 so as to bias the curved portion 34 outwardly from the curved channel ramp 30 and into continuous engagement with the tail block 3.

There may be instances where it is not necessary for the curved portion 34 to be biased so as to always urge the barb 35 in contact with the tail block 3. In this case a bias may still be provided where the spring 37 is arranged as a tension spring urging the curved portion 34 to reside within the curved channel ramp 30. This is advantageous for it avoids any incidentle contact with the barbs 35 until the coupler 20 is ready to be used.

In using the coupler 20, the elongate body 22 is grasped and the actuating member 40 is pulled so as to retract the curved portion 34 of the prong members 32 within the curved channel ramp 30. The second surface 21 of the elongate body 22 is then placed flush against a suitable supporting surface such as the tail block 3, as shown FIG. 6. The actuating member 40 is then pressed until the lower surface 44 contacts the first surface 23 of the elongate body 22 in which condition the prong members 32 are in the engaged position, as shown in FIG. 7.

The diameter D2 of the opening 42 is made larger than the diameter D1 of the blind bore 25 so that one may place a finger through the opening 42 and press upon the portion of the first surface 23 adjacent to the sidewall 27. This is effective in precluding any movement of the elongate body 22 as the prong members 32 penetrate a supporting surface thereby maintaining the second surface 21 flush.

The outer periphery 41 of the actuating member 40 is made so as to extend beyond the outer surface 24 of the elongate body 22. This is beneficial for it provides a surface lip for one to grasp making it easier to manipulate the actuating member 40. In removing the coupler 20 this surface lip may be conveniently grasped and pulled to place the actuating member 40 in the retracted position after which the coupler 20 may be removed. After removal the prong members 32 which had penetrated the wood and thus been removed leave only a very small prick mark that does not mar the material of the instrument body thus retaining the value and aesthetics of the stringed instrument.

Figure 4:
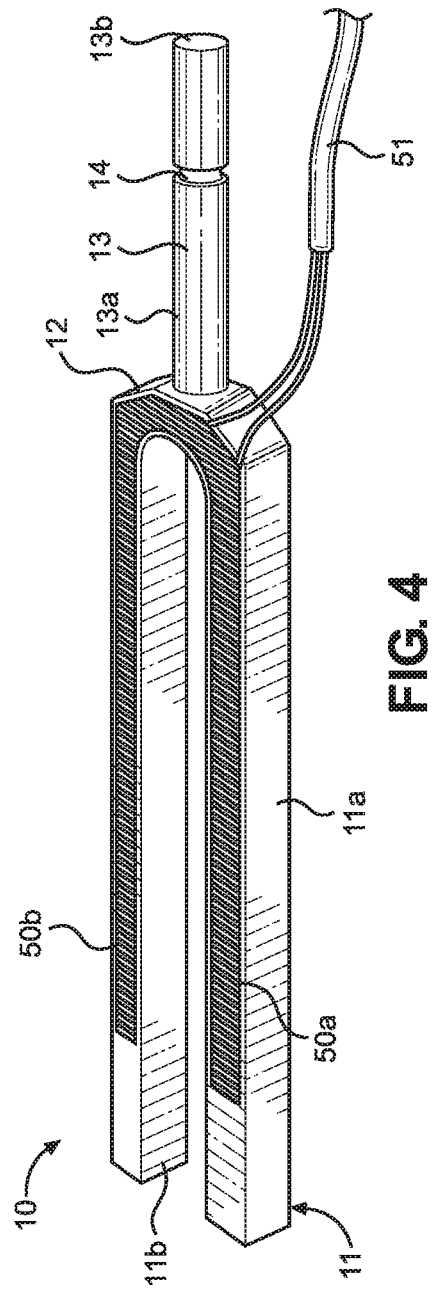
FIG. 4 is a perspective view illustrating an energy harvester device according to an embodiment of the present invention of FIG. 1.

Referring now to FIG. 4 there is shown an energy harvester device 10 of the present invention. The energy harvester device 10 is comprised of an acoustic resonator such as a tuning fork 11. The tuning fork 11 is composed of a shaft 13 having a terminal end 13b and a proximal end 13a. Attached to the proximal end 13a of the shaft 13 is a base 12. Extending upwardly from the base 12 is a pair of tines 11a, 11b. It is this arrangement which permits for the resonating at a specific constant pitch when set vibrating.

Piezoelectric patches 50a, 50b are bonded to an upper surface of each tine 11a, 11b. The piezoelectric patches 50a, 50b may be composed of a piezoelectric material called "macro fiber composites". Macro fiber composites consist of piezoelectric fibers, an epoxy matrix, and polyimide electrodes which upon deflection produces an electrical charge on its electrodes proportional to the deflection. The piezoelectric patches 50a, 50b are operably connected by lead wires 51 to the energy harvester electronics 60 where electricity is sent for conditioning as will be further explained.

Provisions are provided for releasably mounting the shaft 13 within the blind bore 25 of the elongate body 22. Such provisions preferably being that of a quick release connection. In the exemplary embodiment, the elongate body 22 is provided with one or more spring biased ball plungers 38 in communication with the blind bore 25. The shaft 13 is provided with a peripheral groove 14 that is configured so as to securely receive the spring biased ball plunger 38. As shown in FIG. 7, the shaft 13 is about to be inserted into the blind bore 25 until the terminal end 13b is flush with the bore wall 26. In this position the spring biased ball plunger 38 is engaged with the peripheral groove 14. This arrangement provides for a stable mounting of the tuning fork 11 to the coupler 20.

In lieu of the spring biased ball plunger 38, alternate provisions may be made to releasably retain the shaft 13 of the tuning fork 10 within the blind bore 25. For example, the sidewall 27 may be lined with a friction material, such as rubber, and the shaft 13 may be placed within the blind bore 25 and retained therein by the frictional contact. This arrangement would alleviate the need for the shaft 13 to have the peripheral groove 14. Alternately, a magnet may be secured within the blind bore 25 so as to magnetically attract and hold in place the tuning fork 11. The magnetic field generated by the magnet further aids in accelerating the vibratory sound waves through the coupler 20 and into the body 1. Other alternate types of quick release connections may be used in lieu of the spring biased ball plunger 38 as will be evident to those following the teachings of the present invention.

From the acoustic resonator being applied as shown and described, it will be apparent that as the stringed instrument is set in vibration by the fingers of the player, the sound waves will be caught and reflected by the tines 11a, 11b of the tuning fork 11 and distributed to the bottom board 2, the top sound board, and the side wall 8 of the body 1. In like return, the imparted reflected sound waves to the bottom board 2, the top sound board, and the side wall 8 are redistributed to the tuning fork 11 by virtue of its attachment to the body 1 by the coupler 20 thereby creating a feedback loop thus greatly increasing the mechanical vibration of the tines 11a, 11b. This enhances the deflection imparted to the piezoelectric patches 50a, 50b thereby generating a larger supply of electricity available for harvesting.

Figure 5:
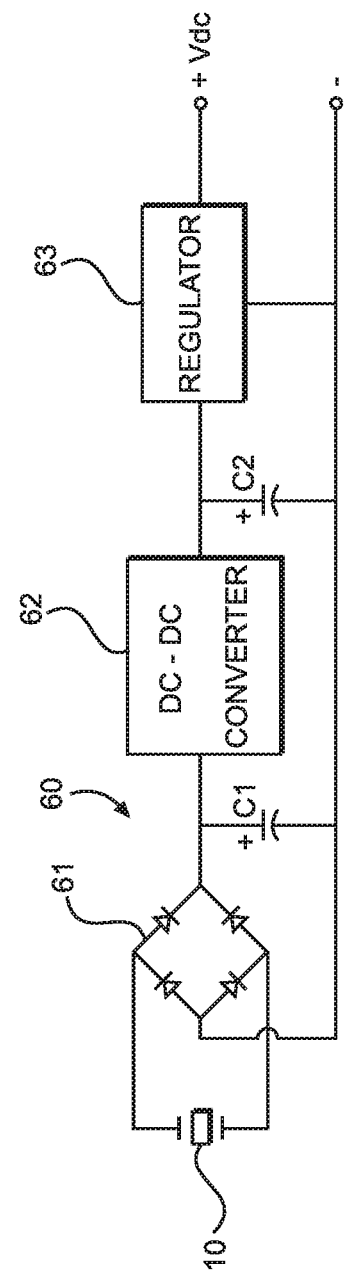
FIG. 5 is a block diagram of an energy harvester electronics according to an embodiment of the present invention of FIG. 1.

FIG. 5 depicts a block diagram schematically showing the circuit of the energy harvester electronics 60. The output of the energy harvester device 10 is an AC voltage. In order for this voltage to be useful it first has to be converted to a DC voltage. This is done by using a full wave bridge rectifier 61. The rectified voltage is followed by a short term storage capacitor C1 of a relatively small value having a high voltage rating. The working voltage of the high voltage rating must be higher than the no-load output value of voltage coming from the full wave bridge rectifier 61. DC-DC converter 62 is configured to convert the high voltage stored on short term storage capacitor C1 to a low voltage at a low impedance for providing a boost to the charge on long term storage capacitor C2. The long term storage capacitor C2 is of a larger value and of a lower voltage rating in relation to short term storage capacitor C1. This is advantageous for the size and cost consideration of a capacitor of a relatively small value having a high voltage rating is minimal. Likewise, the size and cost consideration of a capacitor of a larger value having a lower voltage rating is minimal. These are desired features which facilitate the housing of the energy harvester electronics 60 within the energy harvester module afforded by the tail block 3. The larger value of long term storage capacitor C2 is of a sufficient value allowing the circuit to provide a constant DC voltage source. With this arrangement while long term storage capacitor C2 is charging short term storage capacitor C1 is discharging. The DC-DC converter 62 may be a high frequency stepdown DC to DC converter such as an LT1934-1 buck converter. Other suitable types of DC to DC converters may be employed as will be readily evident to one of ordinary skill.

The DC voltage present at the long term storage capacitor C2 is varied and not particularly suited for efficient operation. Hence, it is necessary to regulate the output voltage +Vdc using a regulator 63. The regulator 63 may be of the 78xx family of self-contained fixed linear voltage regulators. For providing a 5 volt DC regulated power supply the regulator 63 would be an 7805 IC. In those instances where a different voltage is required, such as a 9 volt DC supply, the regulator 63 would be an 7809 IC. Multiple voltages of different values may be configured by employing the desired regulator 63 and regulating the voltage provided by the long term storage capacitor C2. The regulated output voltage +Vdc is communicated to the supply wires 52 which then routes the power to its desired destination.

The components of the energy harvester electronics 60 may be suitably mounted and arranged on a circuit board (not shown) and housed within the interior volume of the tail block 3. As discussed above, the tail block 3 functions as an energy harvester module for in addition to stabilizing the sides of the side wall 8 where they meet at the lower bout, the tail block 3 provides a housing for the components of the energy harvester electronics 60. In addition the tail block 3 presents a convenient structure for accommodating the lead wires 51 and supply wires 52 such that they can communicate with the energy harvester electronics 60.

Referring to FIG. 1, the side wall 8 of the body 1 is provided with a USB port 53. The supply wire 52 is operably connected to the USB port 53 so as to provide power supplied by the energy harvester electronics 60. A cable 54 is used so as to interface with the charging port of a rechargeable portable device 55 to the USB port 53. This allows for the requisite power to be supplied in recharging the portable device 55. Anyone of a number of rechargeable devices including that of a smart phone, tablet computer, or vape may be recharged according to the present invention. The power supplied by the energy harvester electronics 60 may be directed to a rechargeable battery (not shown) that is in communication with the USB port 53 such that a power bank is configured. This is advantageous for it does not require the active playing of the instrument to provide power. While the port is disclosed as a USB port 53 it is within the scope of the present invention to utilize other types of charging ports so as to be compatible with any number of different peripherals.

The body 1 is provided with on-board electronics 56, such as a preamp or an eq, composed of a control panel having a compartment for a rechargeable battery (not shown) which is configured to provide power to processing circuitry. The supply wire 52 is operably connected to the rechargeable battery so as to provide power supplied by the energy harvester electronics 60. This is advantageous for the rechargeable battery is recharged everytime the instrument is played.

The embodiments of the invention described herein are exemplary and numerous modifications, variations and rearrangements can be readily envisioned to achieve substantially equivalent results, all of which are intended to be embraced within the spirit and scope of the invention. For example, the disclosed shape of the coupler 20 has been that of a cylindrical shape so as to facilitate the understanding of the present invention. It is to be understood that following the teachings of the present invention any one of numerous polygram shapes may be used in lieu of the cylindrical shape. Thus the elongate body 22 and the actuating member 40 may be one of rectangular, square, hexagonal, octagonal, or the like. In similar fashion the blind bore 25 and the shaft 13 may also be one of numerous complementary polygram shapes.

The Figures depict the second surface 21 as having a planar configuration so as to lie flush against a planar surface of the tail block 3. It is well within the scope of the present invention to mount the coupler 20 to a surface that is non-planar. In this instance the configuration of the second surface 21 is altered to provide a mating surface that complements the non-planar surface for a flush mounting.

It has been disclosed that the portion of the channel 28 adjacent to and exiting from the second surface 21 is radiussed inwardly towards a center of the elongate body 22 so as to define the curved channel ramp 30. However, it is well within the teachings of the present invention for the portion of the channel 28 that is adjacent to and exiting from the second surface 21 to be radiussed outwardly towards the outer surface 24 if such an arrangement would be beneficial in providing a stable mount.

In those circumstances where the surface of the supporting structure is substantive, i.e. the tail block 3 is of a large depth, the channel 28 may be linear without the use of the curvered channel ramp 30. In this instance the prong member 32 need not comprise a curved portion 34 but suffice to have the barb 35 disposed on the distal end of the longitudinally extending prong member 32.

As stated above the relatively stiff wire of the prong member 32 may be thickened and hardened to change its strength requisites. However, it is to be understood that other characteristics may be employed to achieve the desired strength requisites. For example, the wire may have a first diameter that gradually increases to a larger second diameter, or the cross section of the wire may need not be that of a circular shape but rather that of a suitable polygonal shape that varies in cross-section. As used herein the term "wire" to describe the relatively stiff wire of the present invention is not limiting to that of a wire of metal or an alloy. Rather, the wire may be of any material that can provide the desired strength requisites including that of a suitable polymer.

A larger supply of electricity may be harvested by operably interconnecting the piezoelectric patches 50a, 50b of a plurality of tuning forks 11 to each other either in parallel or in series thereby generating a larger supply of power. For example, the use of twelve tuning forks 11 will represent an entire octave of twelve half-tones. Twelve couplers 20 would be selectively mounted within the body 1 at a desired placement such as the bottom board 2, cross bracing 4, reinforcement strip 5, or top sound board. With this arrangement of the couplers 20 it may be necessary to provide the shaft 13 of the tuning fork 11 with a right-angle bend to reorient the tines 11a, 11b such that they will reside comfortably within the body 1. Thus, the tuning forks 11 so placed will respond to each corresponding tone played forming a sympathetic vibrating system and will sound sympathetically thereby further enhancings the deflection imparted to the piezoelectric patches 50a, 50b. It is understood that the number of tuning forks 11 may be increased or decreased and the pitches thereof varied so as to suit the nature of the stringed instrument. Similarly, additional piezoelectric patches 50a, 50b may be bonded to multiple surfaces of each tuning fork 11 so as to provide a larger supply of electricity available for harvesting.

The acoustic resonator has been described in accordance with a tuning fork 11, however, it is within the scope of the invention to use different types of acoustic resonators. All that is required is for the acoustic resonator to be of any proper shaped piece of material to which the piezoelectric patches 50a, 50b may be bonded and be susceptible of vibrations. For example, the acoustic resonator may be a cup shaped metal sound distributor, a metal spring of an inverted spiral form, or a flat bar tuned to a desired pitch.

While the preferred embodiments employs the use of the coupler 20 for securing the acoustic resonator it is within the teachings of the present invention to utilize other methodologies. For example, the coupler may be comprised of screw threads disposed on the shaft 13 so that the acoustic resonator may be directly mounted to the tail block 3.

Alternately, the coupler may be that of a fastener configured to directly mount the acoustic resonator to the body 1. Suitable fasteners include but are not limited to nails, screws, adhesive, magnetic, hook and loop.

In those instances where it is desired to mount an acoustic resonator that does not have a shaft 13 it is well within the teachings of the present invention to utilize any alternate fastening arrangement. For example, in lieu of the blind bore 25 one of a strip of hook and loop fastener may be placed on the first surface 23 and the other of the hook and loop fastener may be placed on the item for fastening thereto. Alternately, one of a hook, snap fastener, magnet, adhesive or the like may be placed on the first surface 23 as a fastening arrangement.

As it has been disclosed that the components of the energy harvester electronics 60 may be suitably mounted and arranged on a circuit board (not shown) and housed within the interior volume of the tail block 3 it is well within the scope of the invention to house the energy harvester electronics 60 in a different location other than the tail block 3. For example, a separate housing may be provided within the body 1 to conveniently accommodate the energy harvester electronics 60. Such a need may arise when the present invention is used with a semi-hollow body guitar where space may be limited.

A disclosed preferred embodiment of the energy harvester device 10 is directed to the acoustic chamber of a stringed instrument comprised of a body 1 defined by a bottom such as a board or back piece 2 circumscribed by a side wall 8. It is well within the scope of the present invention to employ the energy harvester device 10 with other like acoustic chambers which are subjected to mechanical vibrations. For example, a watercraft such as a boat or ship is comprised of a hull defined by a bottom circumscribed by a side wall thus defining an acoustic chamber. As the hull traverses through the water impact forces are generated producing mechanical vibrations suitable to be imparted to the energy harvester device 10. Similarly, aircraft are comprised of a hull defined by a bottom circumscribed by a side wall thus defining an acoustic chamber. As the aircraft hull traverses through the air frictional forces are generated producing mechanical vibrations suitable to be imparted to the energy harvester device 10. An automobile body defines an acoustic chamber subjected to mechanical vibrations which is particularly adaptable to the energy harvester device 10 of the present invention. Machinery operable by a motor that include an enclosure or housing composed of a body defined by a bottom circumscribed by a side wall are excellent examples of an acoustic chamber according to the teachings of the present invention. Mechanical vibrations afforded by the operation of the machinery's motor provides an ample source of energy to be harvested by the energy harvester device 10 of the present invention.

It will be understood that certain features and subcombinations are of utility and may be employed without reference to other features and subcombinations and are contemplated within the scope of the claims. The present invention is not limited to the embodiments described above, but encompasses any and all embodiments within the scope of the following claims.

What is claimed is new and desired to be protected by Letters Patent is set forth in the appended claims:

1. A body for an acoustic chamber, said body including a bottom circumscribed by a side wall, said body having mounted therein an energy harvester device, said energy harvester device comprising:

an acoustic resonator configured to produce a mechanical vibration at a resonate pitch when set vibrating by said body;

a coupler for mounting said acoustic resonator within said body;

a piezoelectric material disposed on said acoustic resonator, said piezoelectric material is configured to produce an electrical charge in response to said mechanical vibration;

an energy harvester electronics configured to receive said electrical charge, said energy harvester electronics conditioning said electrical charge into a regulated output voltage;

said body further comprises one of a charging port or on-board electronics, wherein said regulated output voltage is configured to supply power to one of said charging port or on-board electronics.

2. The body of claim 1, wherein said electronic harvester electronics comprises:

a bridge rectifier configured to receive and convert said electrical charge to a DC voltage;

a short term storage capacitor configured to store said DC voltage, said short term capacitor is of a relatively small value having a high voltage rating;

a DC-DC converter configured to convert voltage stored on said short term capacitor to a low voltage at a low impedance;

a long term storage capacitor configured to store said low voltage at a low impedance, said long term capacitor is of a larger value and of a lower voltage rating in relation to said short term capacitor;

a regulator configured to regulate voltage stored on said long term capacitor into said regulated output voltage.

3. The body of claim 2, wherein said high voltage rating of said short term storage capacitor has a working voltage higher than a no-load output value of voltage coming from said bridge rectifier.

4. The body of claim 3, wherein said larger value of said long term storage capacitor is of a sufficient value configured to provide a constant source of voltage to said regulator.

5. The body of claim 2, wherein said piezoelectric material is operably connected by lead wires to said bridge rectifier.

6. The body of claim 5, wherein said regulated output voltage is communicated to supply wires configured to route power to one of said charging port or on-board electronics.

7. The body of claim 6, further comprising an energy harvester module having an interior volume configured to house said energy harvester electronics and accommodate said lead wires and said supply wires.

8. The body of claim 1, wherein said coupler comprises:

an elongate body having an outer surface, said elongate body having at an end a first surface and at an opposed end a second surface, said elongate body having at least one channel adjacent to said first surface and extending longitudinally therethrough and exiting to said second surface, said elongate body having an aperture disposed through said first surface and in communication with said channel;

an actuating member having an upper surface and an opposed lower surface bounded by an outer periphery;

at least one prong member having a first end attached to said lower surface of said actuating member and extending therefrom through said aperture and into said channel of said elongate body;

said coupler having a retracted position in which said first end of said prong member extends above said first surface of said elongate body so as to elevate said actuating member thereabove;

said coupler having an engaged position in which said actuating member is pressed so as to abut said first surface of said elongate body thereby advancing said prong member from said channel so as to penetrate said body.

9. The body of claim 8, wherein said first surface of said elongate body comprises a blind bore having a side wall and terminating at a bore wall, said blind bore defining an opening of a first size; said actuating member comprises an opening of a second size larger than said first size for permitting access to and for holding said elongate body in place as said actuating member is pressed to said engaged position.

10. The body of claim 9, wherein said acoustic resonator comprises a shaft having a terminal end configured to be received by said blind bore such that said terminal end abuts said bore wall thereby providing for a releasable mounting.

11. The body of claim 10, wherein said coupler further comprises a spring biased ball plunger in communication with said blind bore; said shaft of said acoustic resonator comprises a peripheral groove configured so as to securely receive said spring biased ball plunger when said terminal end abuts said bore wall thereby providing said releasable mounting with a quick release connection.

\* \* \* \* \*